United States Patent [19]

Kaloyeros et al.

[11] Patent Number: 6,090,709
[45] Date of Patent: Jul. 18, 2000

[54] METHODS FOR CHEMICAL VAPOR DEPOSITION AND PREPARATION OF CONFORMAL TITANIUM-BASED FILMS

[75] Inventors: Alain E. Kaloyeros, Slingerlands, N.Y.; Barry C. Arkles, Dresher, Pa.

[73] Assignees: Gelest, Inc., Tullytown, Pa.; The Research Foundation of State University of New York, Albany, N.Y.

[21] Appl. No.: 08/989,553

[22] Filed: Dec. 12, 1997

Related U.S. Application Data

[63] Continuation of application No. 08/322,020, Oct. 11, 1994, abandoned.

[51] Int. Cl.$^7$ .................................................. H01L 21/44
[52] U.S. Cl. ........................ 438/685; 438/656; 438/648; 438/680; 438/653
[58] Field of Search .................................. 438/656, 648, 438/680, 683, 653, 685

[56] References Cited

U.S. PATENT DOCUMENTS

| | | | |
|---|---|---|---|
| 4,535,000 | 8/1985 | Gordon | 427/160 |
| 4,859,617 | 8/1989 | Nomoto et al. | 437/40 |
| 4,882,224 | 11/1989 | Moro et al. | 428/403 |
| 4,884,123 | 11/1989 | Dixit et al. | 437/192 |
| 4,897,709 | 1/1990 | Yokoyama et al. | 437/197 |
| 4,957,777 | 9/1990 | Iiderem et al. | |
| 5,017,403 | 5/1991 | Pang | |
| 5,173,327 | 12/1992 | Sandhu et al. | |
| 5,246,881 | 9/1993 | Sandhu et al. | 437/192 |
| 5,250,367 | 10/1993 | Santhanam et al. | |
| 5,252,518 | 10/1993 | Sandhu et al. | |
| 5,271,963 | 12/1993 | Eichman et al. | 427/248.1 |
| 5,326,404 | 7/1994 | Sato | 118/723 MR |
| 5,466,971 | 11/1995 | Higuchi | 257/751 |

FOREIGN PATENT DOCUMENTS

| | | |
|---|---|---|
| 0214734 | 11/1981 | Japan . |
| 0218576 | 9/1987 | Japan . |
| 62 218576 | 9/1987 | Japan . |
| 3-214734 | 9/1991 | Japan . |
| WO 95/33866 | 12/1995 | WIPO . |

OTHER PUBLICATIONS

Y. Inoue et al., "Behavior of TiN and Ti Barrier Metals in Al–Barrier–Al Via Hole Metallization", *J. Electrochem. Soc.* 141:4 (Apr. 1994) pp. 1056–1061.

N. Yoshikawa et al., "Microstructures of Chemical–Vapour–Deposited TiN Films", *Mat. Res. Soc. Symp. Proc.* 343 (1994) pp. 741–746.

K. Glejbøl et al., "Nucleation of CVD–TiN on Tungsten", *J. Mater. Res.* 8:9, (Sep., 1993) pp. 2239–2244.

A. Intermann et al., "Film Properties of CVD Titanium Nitride Deposited with Organometallic Precursors at Low Pressure Using Inert Gases, Ammonia, or Remote Activation", *J. Electrochem. Soc.* 140–11 (Nov. 1993) pp. 3215–3222.

(List continued on next page.)

*Primary Examiner*—Trung Dang
*Attorney, Agent, or Firm*—Akin, Gump, Strauss, Hauer & Feld, L.L.P.

[57] ABSTRACT

Titanium and titanium nitride layers can be produced by chemical vapor deposition (CVD) processes conducted at temperatures below 475° C. The layers may serve as diffusion and adhesion barriers for ultra-large scale integration (ULSI) microelectronic applications. The processes use a titanium halide precursor, such as titanium tetraiodide, and hydrogen or hydrogen in combination with nitrogen, argon, or ammonia to either produce pure titanium metal films, titanium films which alloy with the underlying silicon, or titanium nitride films. The deposition of titanium metal from titanium halide and hydrogen or the deposition of titanium nitride from titanium halide with nitrogen and hydrogen is achieved with the assistance of a low energy plasma. The process allows smooth and reversible transition between deposition of films of either titanium metal or titanium nitride by introduction or elimination of nitrogen or ammonia.

30 Claims, 8 Drawing Sheets

OTHER PUBLICATIONS

K. Ikeda et al., "TiN Thin Film Prepared by CVD Method Using $Cp_2Ti(N_3)_2$", *Proceedings of the 1992 Dry Process Symposium*, (1992), pp. 169–173.

R. Andrievskii et al., "Structure, Hardness and Recrystallization of Alloyed Laminated Films Based on Titanium Nitride", *Institute of New Chemical Problems, Russian Academy of Sciences*. Translated from Neorganicheskie Materialy, 28:2 (Feb., 1992) pp. 365–368. © 1992 Plenum Publishing Corporation (pp. 268–271).

V. Ivanov et al, "Prediction of Inorganic Cationic Conductors $A_a B^{VIII-a} X_4 (a=2,5,6)$ and $A_7 B^V Y_4$ According to Geometrical Criteria for $A_3 B^V X_4$", S. Ordzhonikidze Novocherkassk Polytechnical Institute. Translated from Neorganicheskie Materialy, 28:2 (Feb., 1992) pp. 369–372. Original article submitted Mar. 5, 1991. © 1992 Plenum Publishing Corporation (pp. 271–274).

Y. Lomnitskaya et al., "Interaction of Zirconium of Zirconium or Hafnium With Vanadium and Phosphorous", *I. Franko L'vov State University*. Translated from Neorganicheskie Materialy, 28:2 (Feb., 1992) pp. 373–377. © 1992 Plenum Publishing Corporation (p. 274).

M. Rutten et al., "Failure of Titanium Nitride Diffusion Barriers During Tungsten Chemical Vapor Deposition: Theory and Practice" (Abstract, Fig. 1).

J. Hillman et al., "Process for LPCVD Titanium Nitride Deposition" (Abstract, Figs. 1–5).

G. Sandhu, "Characterization for TiN Films Deposited Using Metal–Organic Chemcial Vapor Deposition" (Abstract, Figs. 1–3).

Y. Shacham–Diamand et al., "ULSI Application of Spin–On Titanium–Nitride" (Abstract, Figs. 1–6), Submitted Oct. 8–10, 1991 to the Advanced Metallization for ULSI Applications (1991).

E. Travis et al., "An Intergrated CVD TiN Barrier and Self–Aligned Tungsten Plug Contact Technology for High Aspect Ratio Submicron Contracts" (Abstract, Figs. 1–9).

P. Gröning et al., "Interface Analysis of Plasma–Deposited Titanium Nitride on Stainless Steels", *Applied Surface Science* 62 (1992) pp. 209–216.

Y. Massiani et al., "Photoelectrochemical Characterization of Oxidized Films of Titanium Nitride and Titanium Obtained by Reaction Sputtering", *Thin Solid Films* 207 (1992) pp. 109–116.

C. Winter et al., "A Single–Sources Precursor to Titanium Nitride Thin Films. Evidence for the Intermediacy of Imido Complexes in the Chemical Vapor Deposition Process", *J. Am. Chem. Soc.* 114 (1992) pp. 1095–1097.

E. Kobeda et al., "Diffusion Barrier Properties of TiN Films for Submicron Silicon Bipolar Technologies", *J. Appl. Phys.* 72:7 (Oct., 1992) pp. 2743–2748.

R. Joshi et al., "Collimated Sputtering of TiN/Ti Liners into Sub–Half–Micrometer High Aspect Ratio Contacts/Lines", *Appl. Phys. Lett.* 61:21 (Nov., 1992) pp. 2613–2615.

K. Gonsalves et al. "Low–Temperature Deposition of Ti(C, O) on Polyimides via organometallic Precursors" *J. Inorg. Orgmet. Polym.* 1:1 (1991) pp. 131–134.

R. Fix et al., "Chemical Vapor Deposition of Titanium, Zirconium, and Hafnium Nitride Thin Films", *Chem. Mater.* 3:6 (1991) pp. 1138–1148.

A. Kohlhase et al., "Performance and Failure Mechanisms of TiN Diffusion Barrier Layers in Submicron Devices," *J. Appl. Phys.* 65:6 (Mar., 1989) pp. 2464–2467.

K. Sugiyama et al., Temperature Deposition of Metal Nitrates by Thermal Decomposition of Organometalllic Compounds, *J. Electrochem. Soc.* 122:11 (Nov. 1975) pp. 1545–1549.

R. Gordon, "Conformal TiN by Low–Temperature CVD".

Chou, W.B., et al., "Laser Chemical Vapor Deposition of Ti from $TiBr_4$," *Journal of Applied Physics*, vol. 66, No. 1, pp. 191–195, (Jul. 1989).

Yokoyama, N., et al., "LPCVD TiN as Barrier Layer in VLSI," *Journal of the Electrochemical Society*, vol. 136, No. 3, pp. 882–883, (Mar. 1989).

*Database WPI*, Abstract of "Embedding Metal Into Fine Through–Holes for VLSI Prodn.," Abstract No. XP–002125911 (1990).

Joshi, R.V., et al., "Collimated Sputtering of TiN/Ti Liners into Sub–Half–Micrometer High Aspect Ratio Contacts/ Lines," *Applied Physics Letters*, vol. 61, No. 21, pp. 2613–2615, (Nov. 1992).

METHODS FOR CHEMICAL VAPOR DEPOSITION AND PREPARATION OF CONFORMAL TITANIUM-BASED FILMS

CROSS-REFERENCE TO RELATED APPLICATION

This is a continuation of application Ser. No. 08/322,020, filed Oct. 11, 1994, now abandoned.

FIELD OF THE INVENTION

The present invention relates to substrates having titanium-based coatings, and to methodology for preparing such coated substrates. More particularly, the present invention is directed to substrates having sub-micron features and conformal Ti and TiN layers and bilayers coated thereon, and to low-temperature and plasma-promoted chemical vapor deposition techniques to provide Ti and TiN coatings.

BACKGROUND OF THE INVENTION

Titanium (Ti) and titanium nitride (TiN) are refractory materials with ionic structure, covalent bonding and metallic conductivity. These characteristics lead to high specific strengths at elevated temperatures, excellent mechanical, chemical and thermal stabilities, and good resistance to corrosion. These properties have made titanium and titanium nitride important building blocks in the manufacture of very large scale integrated (VLSI) circuitry, where they function as, for example, adhesion layers and diffusion barriers. VLSI fabrication also makes use of Ti—TiN bilayers on silicon substrates, where titanium functions as a getter for oxygen at the silicon interface. Such a bilayer provides significantly lower and more stable contact resistance than a titanium nitride single layer, and improved adhesion and diffusion barrier properties, compared to a titanium metal single layer, for the subsequent aluminum- or copper-based plug or interconnect layer.

The advent of ultra-large scale integration (ULSI) multi-level metallization (MLM) schemes (see, e.g., M. Rutten et al., in *Advanced Metallization for ULSI Applications*, ed. V. Rana et al., Mat'l Res. Soc. Pittsburgh, Pa., p. 227, 1992), has seen the development of substrates having features, such as holes, vias and trenches, of diameter less than 1 micron, often less than 0.5 micron and even less than 0.25 micron. These finely patterned substrates that are typically used in ULSI circuitry, will be referred to herein as sub-micron substrates. The sub-micron substrates used in ULSI circuitry have features with aspect ratios, i.e., the ratio of the depth to the width of a feature when viewed in cross-section, of about 3:1, sometimes 4:1 and sometimes even 6:1.

Reliable methodology has not heretofore existed for the coating of conformal, high-quality Ti and TiN films onto the finely patterned substrates used in ULSI circuitry. And yet there is a critical need for appropriate adhesion layers and diffusion barriers which may be met by Ti and TiN films. Physical vapor deposition methods, such as sputtering, which were successfully used in manufacturing VLSI devices, are unable to meet the requirements of the new ULSI devices. As feature sizes are reduced into the half-micron range and below, sputtering techniques provide undesirably non-conformal coverage. For example, sputtering causes thinning at vias, hole edges and walls, and keyholes in the vias and trenches. Further, the deposits provided by sputtering techniques frequently contain trapped sputter gas and possess a columnar growth structure which seriously inhibits their usefulness as diffusion barriers. See, e.g., S. Saitoh et al., ibid, p. 495; M. Jiminez et al., *J. Vac. Sci. Tech.* B9, p. 1492, 1991; and A. Noya et al., *Jpn. J. Appl. Phys.*, 30, p. L1760, 1991. Efforts to resolve these problems through the development of modified physical vapor desorption techniques, such as collimated reactive sputtering, have been unsuccessful to date because of, for example, reduced throughput due to the use of a collimator, undesirable particulate generation, and increased sensitivity to processing conditions.

Chemical vapor deposition (CVD) is a process whereby a solid film is synthesized from the reaction products of gaseous phase precursors. The energy necessary to activate the precursors and thereby start the chemical reactions which lead to film formation, may be thermal and/or electrical, and may be reduced by catalytic activity at the surface of the substrate to be coated. It is this reactive process which distinguishes CVD from physical deposition processes, such as sputtering or evaporation. CVD potentially offers many intrinsically attractive features for fabrication of Ti and TiN films as demanded by modern microelectronics. For example, CVD can generally provide a high growth rate and conformal coating of substrates having a complex topography of trenches and vias. In addition, catalysis interaction of the substrate with CVD source precursors can possibly lead to selective metal growth.

However, as discussed below, recognized CVD methodology fails to provide Ti and TiN coatings with conformal coverage for substrates having sub-micron features as typically found in ULSI circuitry. In addition, standard CVD methodology requires processing temperatures in excess of about 650° C., which is higher than can typically be tolerated in ULSI fabrication when aluminum serves as the material to provide the contacts for the circuit. The use of aluminum contacts effectively requires CVD temperatures of less than about 500° C.

It is known to prepare titanium metal films by use of plasma-assisted CVD (PACVD) of $TiCl_4$ in a mixture of nitrogen and hydrogen; by electron cyclotron resonance (ECR) plasma CVD of $TiCl_4$ in a nitrogen atmosphere; and by atmospheric pressure CVD (APCVD) using $TiCl_4$ and isopropylamine as coreactants. See, e.g., M. Hilton et al., *Thin Solid Films*, 139, p. 247, 1986, and T. Akahori et al., *Proc. Int'l Conf. on Solid State Devices and Materials*, Yokohama, Japan, p. 180, 1991. These efforts led to an appreciable reduction in process temperature, to within the desired range of about 350° C.–500° C. However, film step coverage was only 30%–70% for features of low aspect ratio, and the films exhibited undesirably high resistivities of nearly 200 $\mu\Omega$cm. In addition, the films suffered from chlorine contamination to the extent of several atomic percent.

Early attempts at preparing titanium nitride films using CVD mostly involved coreacting titanium tetrachloride ($TiCl_4$) and ammonia ($NH_3$) to yield TiN films with resistivities in the range of 50 to 100 $\mu\Omega$cm. These early attempts provided films having good step coverage and diffusion barrier properties. See, e.g., A. Sherman, *J. Electrochem. Soc.*, 137, p. 1892, 1990. In addition, films produced thereby had impurities, mainly chlorine, at a concentration of less than about one atomic percent. See, e.g., J. Hiollman et al. in *Advanced Metallization for ULSI Applications*, ed. V. Rana et al., Mat'l Res. Soc. Pittsburgh, Pa., p. 319, 1992. However, the high processing temperatures involved in producing these films, typically in excess of 650° C., prohibit this technology from being used to prepare ULSI devices, which can tolerate temperatures not greater than about 500° C.

There are several reports of the use of organometallic precursors to prepare titanium and titanium nitride films by CVD. For example, there are several recent reports on metal-organic CVD (MOCVD) of TiN from dialkylamino derivatives of titanium of the type $Ti(NR_2)_4$, where R is a methyl or ethyl group. See, e.g., R. Fix et al., *MRS Symp. Proc.*, 168, p. 357, 1990; and K. Ishihara et al., *Jpn. J. Appl. Phys.*, 29, p. 2103, 1990. Additional MOCVD studies involving the use of single source titanium precursors of the type $TiCl_2(NHR_2)$ $(NH_2R)$ and $TiCl_4(NR_3)_2$ have been reported. See, e.g., C. Winter et al. in *Chemical Perspectives of Microelectronic Materials III*. ed. C. Abernathy et al., MRS, Pittsburgh, Pa. 1992; and K. Ikeda et al., *Proceedings of the 1992 Dry Process Symposium*, p. 169, 1992 (using cyclopentadienyl titanium compounds, such as bis (cyclopentadienyl) titanium diazide). The use of diimine analogs of β-diketonates such as $Ti(NH)_2C_2CHR_2)_2$ in MOCVD has also been reported. See A. Weber, *The Proceedings of the Schumacher Conference* (San Diego, Calif., 1993). However, the TiN films produced by MOCVD exhibit relatively high resistivities of greater than 200 $\mu\Omega cm$, and a step coverage below 70% even for features of low aspect ratio. In addition, the films contained hydrogen concentrations of up to 50 atomic percent, and a carbon concentration of several atomic percent. These impurities are highly detrimental to the performance of the resulting films and effectively prohibit their use in ULSI devices.

MOCVD has also been studied for the preparation of titanium films. See, e.g., T. Groshens et al., in *Chemical Perspectives of Microelectronic Materials III* ed. C. Abernathy et al., MRS, Pittsburgh, Pa. 1992, for using MOCVD techniques with neopentyltitanium $(Me_3CCH_2)_4Ti$ and sila-neopentyltitanium $(Me_3SiCH_2)_4Ti$. Cyclopentadienyl-based compounds have also been explored as precursors to titanium films. See, e.g., N. Awaya et al., Japanese Patent No. 01/290,771, 1989. However, as in the case of TiN, the resulting Ti films exhibited high resistivity, and carbon and hydrogen content in excess of 10 atomic percent, making them undesirable for use in ULSI circuitry fabrication.

It is known that titanium halides will decompose to Ti at temperatures in excess of 1300° C. This reaction, which is known as the Van Arkel process (see, A. Van Arkle et al. *Z. Anorg. Allgem. Chem.*, 148, p. 345, 1925) occurs at such high temperatures that it is not useful for ULSI fabrication.

There thus exists a need for technology to provide Ti and TiN films suitable for ULSI fabrication. Such films must be of ultra-high quality, in terms of purity, with impurity concentrations well below 1 atomic percent. Also, the films should desirably exhibit a non-columnar structure in order to perform appropriately as a barrier layer. Further, the films should be conformal to the complex topography of ULSI circuitry, and provide step coverage in excess of 70%. It is desirable that technology be developed which can readily prepare single films containing either Ti or TiN, as well as bilayer films of Ti and TiN, and that such technology be amenable to process temperatures below about 500° C. in order to prevent thermally induced device damage during processing.

It is especially desirable that a process be developed which allows for the preparation of the above-mentioned films sequentially and in-situ, i.e., without the necessity of transferring a substrate coated with a single film (Ti or TiN) to another reaction chamber to deposit the other film. Thus, according to current technology, the production of a bilayer typically involves the laying down of a first layer in a first reaction chamber, and then transferring the substrate to a second reaction chamber where a second layer is coated onto the first layer. Current technology does not provide a single reaction chamber with the versatility to deposit both Ti and TiN films merely by controlling the operating parameters of the chamber. As is known in the art, a process for the in-situ deposition of sequential bilayers of Ti and TiN is desirable in part because of the high affinity of titanium for oxygen and water. This affinity leads typically to contamination of the Ti film surface during transfer to a second reaction chamber where it is coated with TiN.

SUMMARY OF THE INVENTION

One aspect of the invention is a method for the chemical vapor deposition of a titanium-based film onto a substrate, which comprises introducing to a deposition chamber the following components: (a) a substrate; (b) vapor of a compound having the formula $Ti(I_{4-m-n})$ $(Br_m)$ $(Cl_n)$ (hereinafter formula (I)) wherein m is 0–4 and n is 0–2; (c) a first gas selected from the group consisting of ammonia and hydrazine; and (d) a second gas selected from the group consisting of hydrogen, nitrogen, argon and xenon. These components are maintained in the deposition chamber at a temperature of about 200° C. to about 650° C., preferably about 350° C. to about 475° C., for a time sufficient to deposit a titanium-based film onto the substrate. According to preferred embodiments, the compound of formula (I) is titanium tetraiodide and the molar ratio of nitrogen atoms in component (c) to titanium atoms in component (a) is at least 1:1. The method is particularly useful when the substrate is a silicon or silicon dioxide wafer useful in the manufacture of a ULSI device.

According to another aspect of the invention, a method is provided for the chemical vapor deposition of a is titanium-based film onto a substrate, which comprises introducing to a deposition chamber the following components: a) a substrate; (b) vapor of a compound having the formula (I) as above, and preferably titanium tetraiodide; and (c) at least one gas selected from the group consisting of hydrogen; hydrogen and at least one of nitrogen, ammonia, argon and xenon; nitrogen and at least one of ammonia, argon and xenon; ammonia and at least one of argon and xenon. The above components are maintained in said chamber at a temperature of about 200° C. to about 650° C., preferably about 350° C. to about 475° C., in the presence of a plasma having a plasma power density of about 0.1 to about 0.5 $W/cm^2$. The components are maintained under these conditions for a time sufficient to deposit a titanium-based film onto the substrate. According to preferred embodiments, the gas component (c) is hydrogen or hydrogen in combination with nitrogen or hydrogen in combination with at least one of argon and xenon. A preferred substrate is a silicon or silicon dioxide wafer useful in the manufacture of ULSI devices.

According to another aspect of the invention, a method is provided for depositing multiple layers of titanium-based film onto a substrate while the substrate remains fixed in a single deposition reactor. The method comprises the steps of introducing components, wherein the components are a substrate and a source precursor, into a CVD chamber, where the source precursor is vapor of at least one compound of formula (I) as above, and is preferably vapor of titanium tetraiodide. The method comprises sequentially depositing onto the substrate alternating layers of titanium metal film and titanium nitride film, where either the titanium metal film or the titanium nitride film may be deposited first onto the substrate.

According to a preferred embodiment, a titanium metal film is deposited onto a substrate to provide a coated substrate, and a titanium nitride film is deposited onto the coated substrate. The titanium metal film and the titanium nitride film are formed as described above.

Another aspect of the invention provides a substrate for integrated circuitry having a coating disposed thereon. The substrate has features, such as holes, vias and trenches as typically found on integrated circuits, with dimensions of less than one micron, and preferably less than about 0.5 microns and more preferably less than about 0.25 microns, and aspect ratios of at least about 3:1, preferably at least about 4:1 and more preferably at least about 6:1. The coating is a titanium-based film that is conformally deposited onto the substrate with step coverage greater than about 70%.

BRIEF DESCRIPTION OF THE DRAWINGS

The foregoing summary, as well as the following detailed description of preferred embodiments of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE PREFERRED EMBODIMENTS

Processes utilizing chemical vapor deposition (CVD) have been developed which can prepare titanium-based films suitable as, for example, diffusion barriers and adhesion inter-layers in integrated circuit fabrication, and in particular, in ULSI fabrication. The processes of the invention direct carefully selected precursors into a CVD reactor, under carefully specified reaction conditions, to achieve high quality titanium-based films of the invention.

As used herein, the term "titanium-based film" refers to a film containing titanium. Exemplary titanium-based films include films of titanium metal, titanium nitride, titanium silicide and laminates thereof including a bilayer film of titanium metal and titanium nitride. The titanium-based films of the invention may be substantially pure, or may contain a mixture of phases of titanium-based materials, e.g., a mixture of titanium metal phases with titanium nitride or titanium silicide phases. In addition, the titanium-based films of the invention may contain gas molecules, for example, nitrogen.

To prepare titanium-based films according to the invention, thermal chemical vapor deposition (TCVD) or plasma-promoted chemical vapor deposition (PPCVD), may be employed. As used herein, TCVD refers to a CVD process wherein all reactants are introduced to the CVD reactor in gaseous form, and the energy necessary for bond cleavage is supplied entirely by thermal energy. As used herein, PPCVD refers to a CVD process wherein all reactants are introduced to the CVD reactor in gaseous form, and the energy necessary for bond cleavage is supplied in part by the high energy electrons formed in a glow discharge or plasma having a plasma power density of below about 0.5 $W/cm^2$. PPCVD takes advantage of the high energy electrons present in glow discharges to assist in the dissociation of gaseous molecules, as is the case with plasma-enhanced CVD (PECVD), where PECVD is a well-known technique. However, in contrast to PECVD, which uses high plasma power densities, the low power densities employed in PPCVD do not cause ion-induced substrate and film damage, and allow the formation of films with reduced stress levels. PECVD operated at plasma power density greater than 0.5 $W/cm^2$ is not included within PPCVD according to the invention.

A deposition reactor suited for TCVD or PPCVD according to the invention has several basic components: a precursor delivery system (also referred to as bubbler or sublimator) which is used to store and control the delivery of the source precursor; a vacuum chamber and pumping system to maintain an appropriately reduced pressure as necessary; a power supply to create discharge as necessary; a temperature control system; and gas or vapor handling capabilities to meter and control the flow of reactants and products that result from the process.

Figure 1:
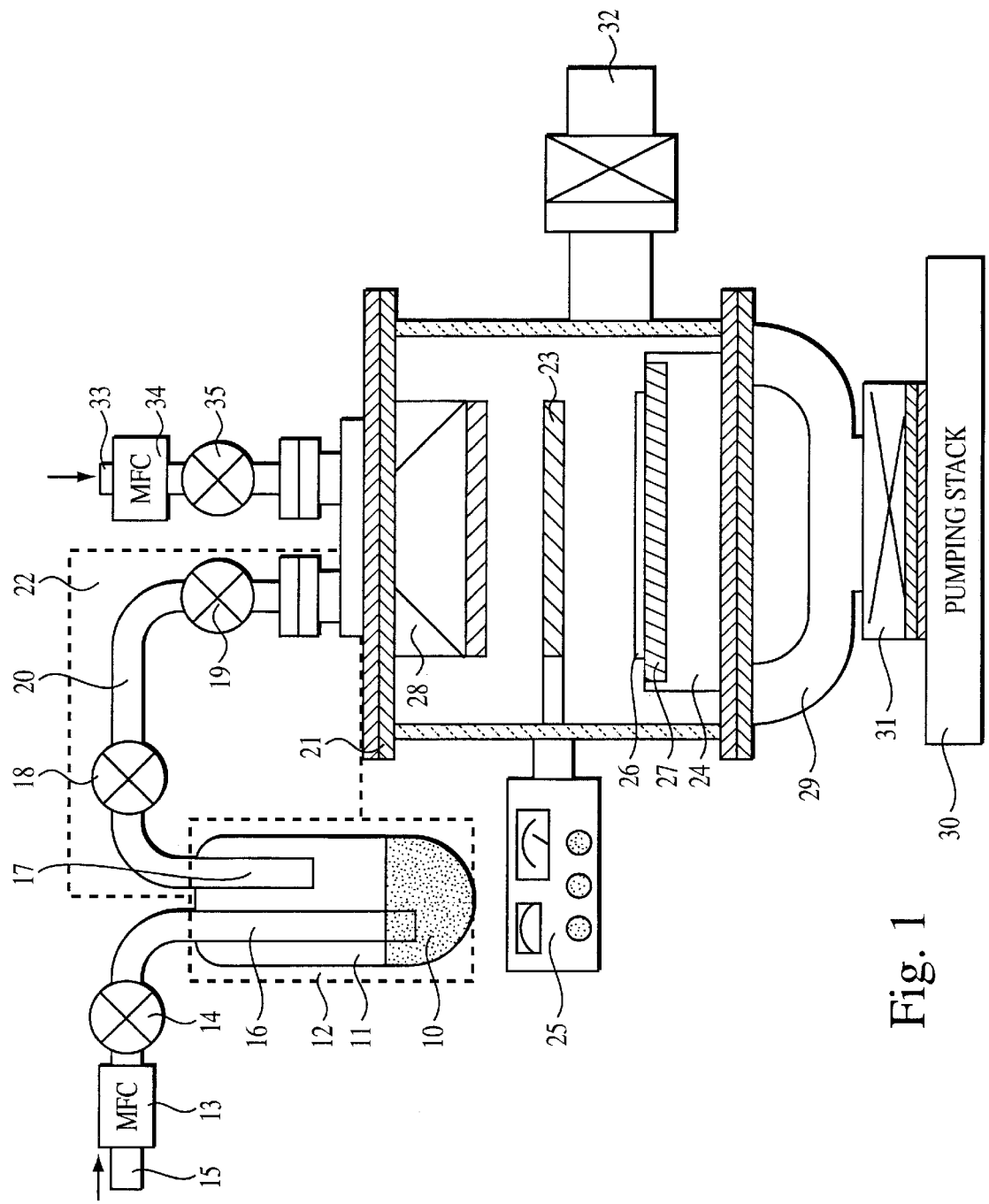
FIG. 1 is a diagrammatic representation of a reaction apparatus used to achieve chemical vapor deposition according to the present invention.

According to one preferred embodiment for the deposition of titanium-based films according to the invention, the deposition reactor shown in FIG. 1 is employed. The source precursor 10 is placed in the bubbler/sublimator 11 which is heated by a combination of resistance heating tape and an associated power supply 12 to a desired temperature. The dashed lines in FIG. 1, labeled 12, encompass parts of the CVD reactor which are heated by the resistance heating tape. A mass flow controller 13, which can be isolated from the bubbler by a high vacuum valve 14, controls the flow of carrier gas 15 through feedthrough 16 into the bubbler. While a carrier gas need not be employed, it is preferable to use a carrier gas in order to better control and accelerate the rate of flow of the source precursor vapor into the deposition chamber.

In a preferred embodiment, the mixture of precursor vapor and carrier gas is transported through feedthrough 17, high vacuum isolation valves 18 and 19, and delivery line 20 into the deposition reactor 21. All transport and delivery lines and high vacuum isolation valves 17, 18, 19, and 20 are maintained at the same temperature as the bubbler/sublimator 11, again using a combination resistance heating tape and associated power supply 22. The dashed lines in FIG. 1 labeled 22 encompass parts of the CVD reactor heated by resistance heating tape, where the heating tape heats the apparatus to prevent precursor recondensation.

The reactor 21 is a cold-wall stainless steel CVD reactor of size sufficient to hold an 8" wafer. It is equipped with a diode-type parallel plate-type plasma configuration made of two electrodes 23 and 24. The upper plate 23 serves as the active electrode and is driven by a plasma generator 25. This upper plate is constructed in a "mesh" type pattern to allow unrestricted reactant flow to a substrate 26, where substrate 26 sits on the lower, grounded plasma electrode 24. The substrate 26 is heated to a process temperature by an 8" boron nitride (BN)-encapsulated graphite heater 27. A specially designed shower head 28 and associated pumping lines 29 are employed to ensure proper reactant mixing and uniformity in reactant delivery and flow over the substrate.

Evacuation of the deposition reactor is possible through use of a pumping stack 30. The pumping stack 30 consists of two pumping packages, where the first is cryogenic pump-based, and the second is roots blower pump-based. The pumping stack may be isolated from the reactor by the high vacuum gate valve 31. The cryogenic pump-based package is used to ensure high vacuum base pressure in the reactor, while the roots blower-based package is employed for appropriate handling of the high gas throughput during actual CVD runs.

A high vacuum load lock system 32 is used for transport and loading of substrate into and out of the reactor. Finally, a side line 33 is employed to feed additional gaseous reactants, i.e., auxiliary gas, into the reactor. The side line gas flow is controlled by the mass flow controller 34 and associated isolation valve 35.

The source precursor 10 according to the invention is at least one titanium containing compound of the formula (I)

wherein m is an integer within the range 0–4 and n is an integer within the range 0–2. Preferably, the compound of formula (I) has n=0, i.e., there are no chlorine ligands. More preferably, the source precursor 10 is titanium tetraiodide, i.e., $TiI_4$.

After being charged to the bubbler/sublimator 11, the source precursor is taken to a temperature which is high enough to ensure the precursor's sublimation or vaporization, but not too high to cause premature decomposition. Preferably, the source precursor is heated to a temperature of about 90° C. to about 160° C.

The carrier gas can be any gaseous substance which is not reactive with compounds of formula (I). Exemplary carrier gases are hydrogen, helium, nitrogen, neon, chlorine, bromine, argon, krypton and xenon. While halogenated gases can function as the carrier gas, non-halogenated gases are preferred because they cannot contribute any halogen contamination to the titanium-based film. The preferred carrier gases are hydrogen, nitrogen and argon. Of course, the carrier gas may also be a mixture of pure gases. Hydrogen is a particularly preferred carrier gas for both TCVD and PPCVD according to the invention.

The flow rate of the carrier gas through the source precursor is controlled by the mass flow controller 13. The flow rate of the carrier gas is about 10 sccm to about 100 sccm, and preferably about 20 sccm to about 60 sccm. A flow rate of about 20 sccm to about 60 sccm is preferred for both TCVD and PPCVD according to the invention.

Under action of the carrier gas, the flow rate of the vapor of the source precursor is about 0.001 sccm to about 1,000 sccm. Preferably, the flow rate of source precursor vapor into the CVD chamber is about 0.1 sccm to about 200 sccm.

The auxiliary gas is at least one of hydrogen, helium, nitrogen, ammonia, hydrazine, neon, chlorine, bromine, argon, krypton and xenon. As with the carrier gas, the preferred auxiliary gases are non-halogenated. The flow of the auxiliary gas, which may be a pure gas or a mixture of gases, is preferably about 10 sccm to about 10,000 sccm, and is more preferably about 100 sccm to about 1,000 sccm.

Although for convenience the gas(es) entering mass flow controller 13 is denoted herein as the carrier gas, and the gas(es) entering the mass flow controller 34 is denoted herein as the auxiliary gas, this terminology should not be misconstrued. In fact, in addition to carrying the vapor of the source precursor into the reaction chamber, the carrier gas may and typically does undergo reaction in the chamber during the deposition process. The auxiliary gas may be inert or include inert components, in which case some or all of the auxiliary gas serves merely to dilute the reactive atmosphere inside the deposition chamber. Likewise, the carrier gas may be inert or contain inert components. The auxiliary gas may also undergo reaction in the CVD chamber.

According to a preferred embodiment of PPCVD, hydrogen is the carrier gas and there is no auxiliary gas. According to another preferred embodiment for PPCVD, hydrogen is introduced into the deposition chamber simultaneously with an inert gas such as neon, argon, krypton or xenon. Preferably, hydrogen is introduced as the carrier gas and at least one of argon and xenon is the auxiliary gas. However, the inert gas may be introduced in admixture with hydrogen, where the mixture serves as the carrier gas. It is also possible for the inert gas to serve as the carrier gas, and have hydrogen introduced as the auxiliary gas. In each of the above instances, a titanium metal film is produced.

PPCVD according to the invention can also be used to prepare titanium nitride (TiN) films. To prepare a TiN film by PPCVD, a nitrogen-containing gas must be introduced into the reactor chamber. Nitrogen ($N_2$), ammonia and hydrazine are exemplary nitrogen-containing gases according to the invention. When nitrogen ($N_2$) is the nitrogen-containing gas, it may be introduced as either a carrier or auxiliary gas, and hydrogen or an inert gas such as argon or xenon may be introduced simultaneously therewith as either a carrier or auxiliary gas. Preferably, at least one of nitrogen, hydrogen and an inert gas is a carrier gas.

When ammonia or hydrazine is the nitrogen-containing gas during PPCVD of a TiN film, then it will be introduced into the deposition chamber as an auxiliary gas, and hydrogen and/or an inert gas such as argon or xenon may be the carrier gas. Hydrogen and/or an inert gas may also be co-introduced as the auxiliary gas, i.e., hydrogen and/or an inert gas may be in admixture with the ammonia or hydrazine gas. Nitrogen in combination with at least one of ammonia and hydrazine may be the sole gases present in the deposition chamber during the preparation of TiN, in which case nitrogen will be the carrier gas. According to a preferred embodiment to prepare TiN film by PPCVD, hydrogen and nitrogen are introduced into the reactant chamber simultaneously with the source precursor.

Titanium nitride films may also be prepared using TCVD according to the invention. To prepare a TiN film by TCVD, ammonia and/or hydrazine is introduced to the deposition chamber as an auxiliary gas, and at least one of hydrogen, nitrogen or an inert gas such as argon or xenon serves as a carrier gas. According to a preferred embodiment, hydrogen is a carrier gas while ammonia is an auxiliary gas.

Regardless of whether TCVD or PPCVD is used to prepare the TiN film, and regardless of the exact identities of the nitrogen-containing gas and the carrier and auxiliary gases, it is important to maintain at least one mole of nitrogen atoms in the reaction chamber for each mole of titanium in the reaction chamber. If insufficient nitrogen is present in the deposition chamber, then titanium metal may be deposited rather than titanium nitride, thereby allowing the formation of a mixed-phase film, i.e., a film having phases of titanium and phases of titanium nitride. While a mixed-phase film may be desired for some applications, and methodology to prepare such titanium-based films and substrates having these films coated thereon is within the scope of this invention, in instances where a pure TiN film is desired, i.e., a film having a Ti:N molar ratio of about 1:1, then an adequate supply of nitrogen atoms must be supplied to the deposition chamber. Excess nitrogen may enhance film stability, and the diffusion barrier properties of a film made with excess nitrogen may demonstrate enhanced diffusion barrier properties.

According to the preferred PPCVD method, the plasma is generated through use of radiofrequency (RF) glow discharges, having frequencies in the MHz range, although plasmas with frequencies ranging from kHz to GHz could be employed. See, generally, Hess, D. W. and Graves D. B., "Plasma-Assisted Chemical Vapor Deposition", Chapter 7 in *Chemical Vapor Deposition, Principles and Applications*, Hitchman M. L. and Jensen, K. F. eds., Academic Press (1993). A preferred frequency is about 1 to about 100 MHz, with about 14 MHz being particularly preferred.

Prior to beginning a sequence of deposition runs, and periodically between depositions conducted during a sequence of runs the deposition reactor is baked under a nitrogen atmosphere to below 0.3 torr and then pumped down to below $10^{-7}$ torr for an hour at 150° C. This process assures cleanliness of the reactor, and is conducted for both TCVD and PPCVD runs.

The substrate 26 is placed into the CVD reactor and then preferably exposed to a cleaning regime. Pre-deposition substrate cleaning is preferably accomplished by exposing the substrate in situ to a hydrogen plasma having a plasma power density of about 0.1 to about 1.0 W/cm$^2$. Substrate cleaning as described is performed for both TCVD and PPCVD.

Prior to introducing the source precursor into the CVD deposition chamber, the chamber atmosphere is evacuated, and the reactor is heated to a process temperature. Preferably, the pressure in the chamber is about 0.001 torr to about 760 torr during the deposition process. More preferably, the atmosphere in the chamber during the deposition has a pressure of about 0.1 torr to about 10 torr. The process temperature during deposition is less than about 650° C. Preferably, the process temperature is about 250° C. to about 500° C., and more preferably about 350° C. to about 475° C.

A plasma may be present during the deposition process in order to promote reaction of the source precursor with other gas(es) present in the reactant chamber. The plasma has a plasma power density of about 0.1 to about 0.5 W/cm$^2$, and preferably has a density of about 0.15 W/cm$^2$ to about 0.3 W/cm$^2$. As described above, when a titanium nitride film is desirably deposited by PPCVD onto a substrate, or onto a coated substrate, the gases nitrogen and hydrogen are preferably present with the source precursor vapor, in the presence of a plasma. When a titanium metal film is desirably deposited onto the substrate, or onto a coated substrate, by PPCVD, hydrogen gas, optionally with at least one of argon and xenon are present with the source precursor, in the presence of a plasma.

The deposition rate of the films of the invention is observed to be about 25 to about 2000 angstroms per minute (Å/min). A typical deposition rate is about 400 Å/min to about 500 Å/min. The films of the invention have a thickness of about 50 angstroms to about 2 microns, and have a preferred thickness of about 500 Å to about 1500 Å. The deposition time is therefore seen to be quite rapid, on the order of seconds or minutes.

The appearance and composition of the titanium-based films prepared according to the inventive methods, as well as their structural and electrical properties, will be described next. It should be noted that the formation of titanium silicide films (TiSi), occurs only when the substrate is silicon or polysilicon and the titanium being deposited is particularly pure titanium metal. In such cases, the substrate-titanium interface can react to form a layer of TiSi. It has been observed that a silicon substrate can catalyze the reaction(s) leading to the deposition of titanium metal.

Titanium and titanium silicide films were prepared in the deposition reactor shown in FIG. 1, according to the PPCVD method of the invention. The source precursor was titanium tetraiodide and it was sublimed at a temperature within the range of 120° C. to 160° C. Films were prepared during reactions wherein the working pressure inside the deposition reactor was from 200 to 400 mtorr, the carrier gas was hydrogen with a flow rate of from 10 to 60 sccm, the auxiliary gas was argon with a flow rate of 400 to 600 sccm and the substrate temperature was from 300° C. to 450° C. The films were deposited onto a silicon wafer.

Figure 6:
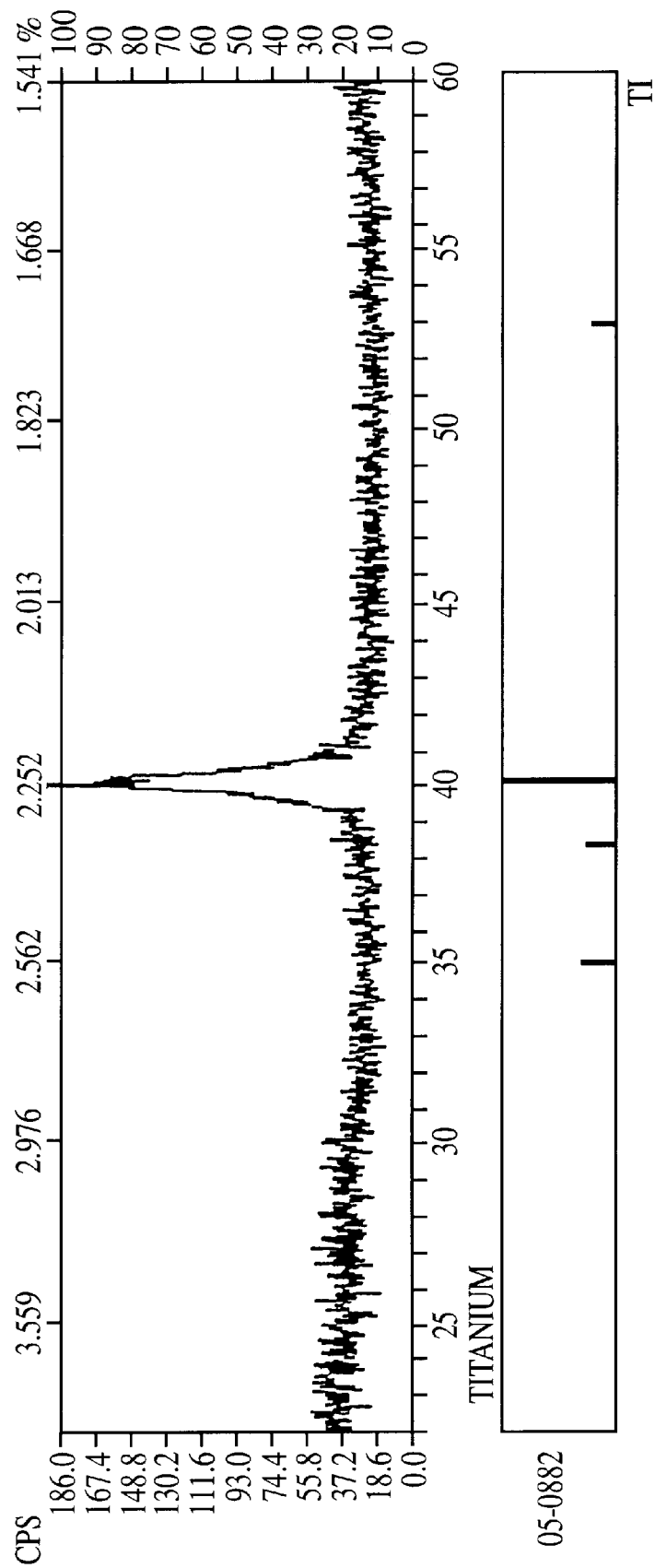
FIG. 6 is an x-ray diffraction (XRD) pattern of a Ti film produced by the plasma-promoted CVD reaction of $TiI_4$ and hydrogen in an argon plasma. The XRD spectrum indicates a clean hexagonal Ti phase.
Figure 7:
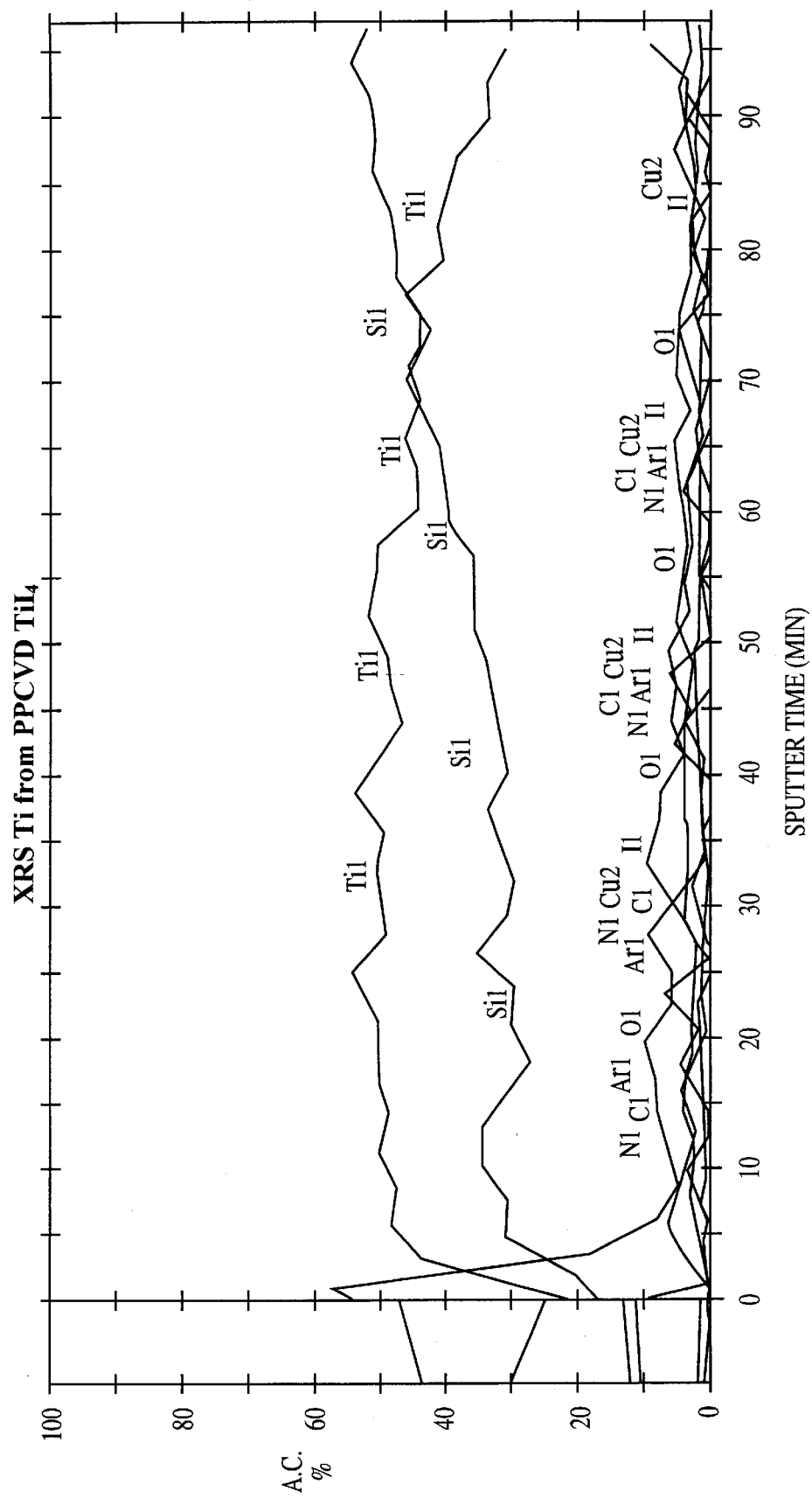
FIG. 7 is an x-ray photoelectron spectroscopy (XPS) spectrum of a Ti film produced by plasma-promoted CVD reaction of $TiI_4$ and hydrogen in an argon plasma. XPS results indicate a pure Ti phase, as documented by its alloying with Si.

The titanium and titanium silicide films thus produced were metallic, continuous, and silver colored. X-ray diffraction (XRD) analysis of a Ti film grown at 450° C. is shown in FIG. 6 for a 1000 Å-thick film on Si. The XRD analysis shows that the film has a hexagonal Ti phase. X-ray photoelectron spectroscopy (XPS) was performed using a Perkin-Elmer Physical Electronics Model 10-360 spherical capacitor analyzer. The gold $f_{7/2}$ line at 83.8 eV was taken as reference line and the analyzer calibrated accordingly. All spectra were obtained using a pass energy of 5 eV at a resolution of 0.8 eV. A primary x-ray beam (Mg Kα, 127 eV) of 15 keV and 300 W was employed. The analysis chamber pressure was in the $10^{-10}$ torr range, and the results were standardized using a sputtered Ti sample. The XPS survey spectra (FIG. 7) indicated that, within the detection limits of XPS, the Ti films produced below 400° C. contained less than 20 atomic percent oxygen, while Ti films produced above 400° C. were free of oxygen and exhibited significant interactions with the Si substrate, which requires pure Ti to occur. No carbon or any other light element contaminants were observed in the films, regardless of substrate temperature. As used herein, light elements refer to elements having atomic number between 3 and 13, inclusive. The presence of iodine was detected at levels of about 0.4 to 1.5 atomic percent. Four-point probe resistivity measurements found that film resistivities as low as 90 $\mu\Omega$cm could be obtained.

The nature of the titanium and titanium silicide films vis-à-vis a silicon substrate was next examined. The adherence of the titanium films to either silicon or silicon dioxide was observed to be good. Cross-section SEM analysis was carried out on a Zeiss DSM940 microscope, employing a 20 keV primary electron beam and a beam current of 4 μA. An SEM micrograph (FIG. 8) of a 1000 Å-thick Ti film showed conformal step coverage of 0.20 μm vias with aspect ratio of 6.

Titanium nitride films were prepared in the deposition reactor shown in FIG. 1, according to the TCVD method of the invention. The source precursor was either titanium tetraiodide or titanium tetrabromide, and the sublimation temperatures were from 120° C. to 160° C. and from 90° C. to 140° C. respectively. Films were prepared during reactions wherein the working pressure inside the deposition reactor was from 200 to 350 mtorr, the carrier gas was hydrogen with a flow rate of from 20 to 60 sccm, the auxiliary gas was ammonia with a flow rate of 400 to 600 sccm and the substrate temperature was from 300° C. to 450° C. The films were deposited onto a silicon wafer.

Figure 2:
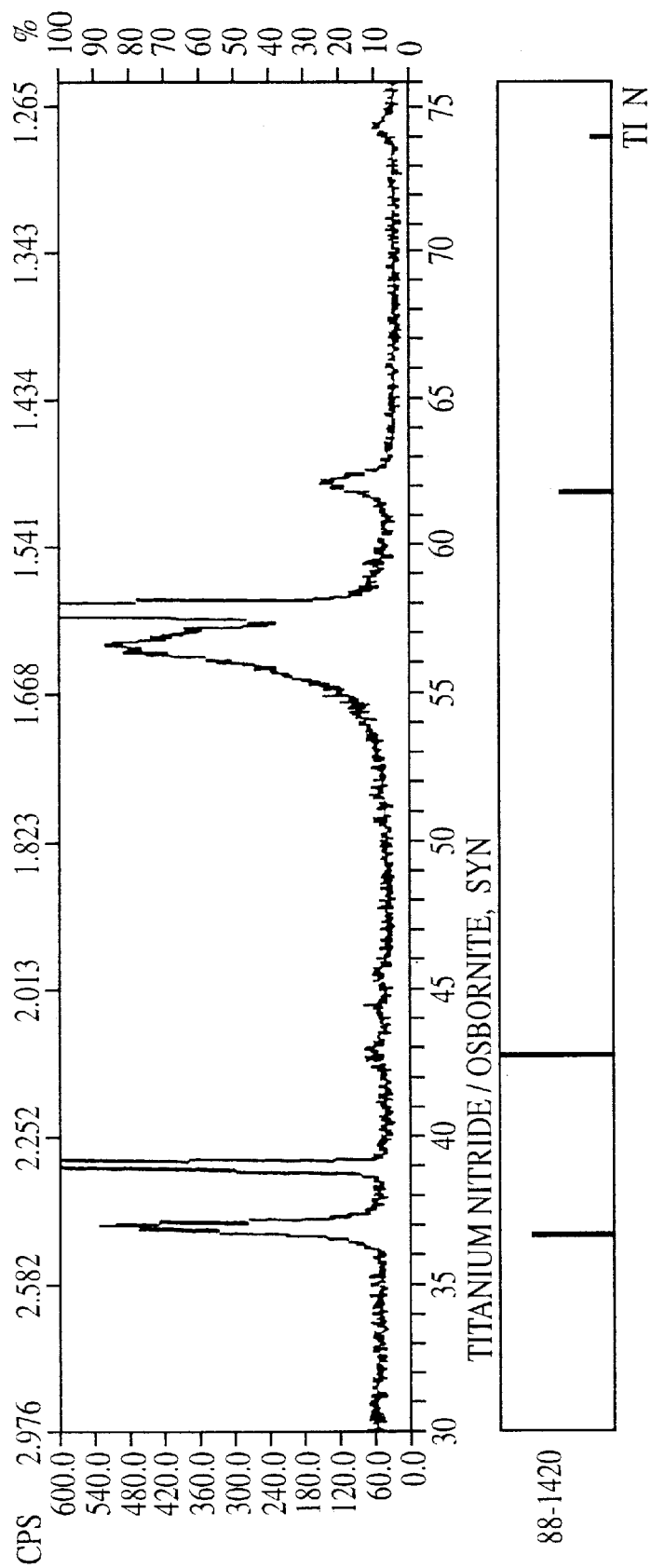
FIG. 2 is an x-ray diffraction (XRD) pattern of a TiN film produced by the TCVD reaction of $TiI_4$ and $NH_3$. XRD indicates a clean (111) TiN phase.
Figure 3:
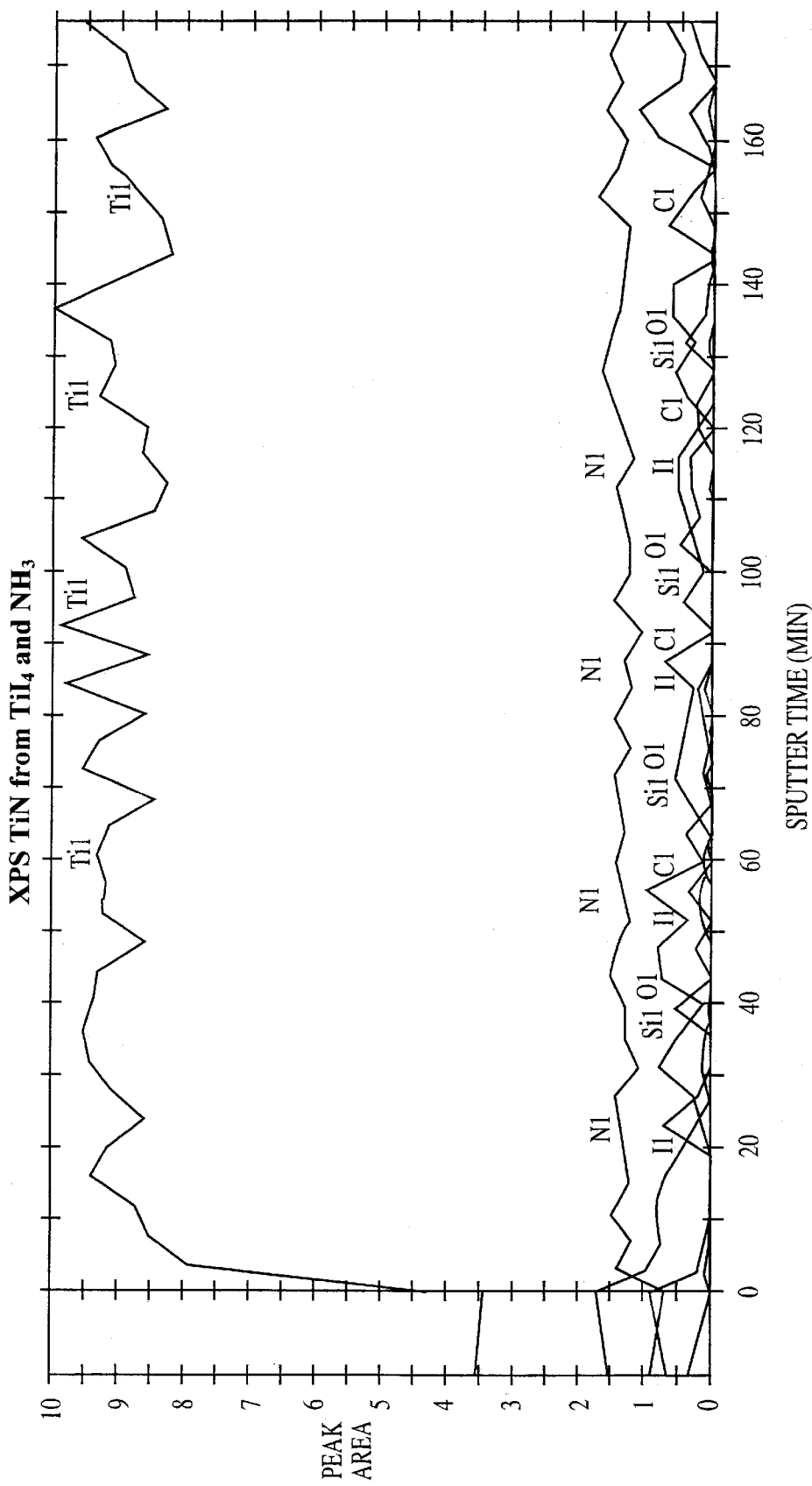
FIG. 3 is an x-ray photoelectron spectroscopy (XPS) spectrum of a TiN film produced by the TCVD reaction of $TiI_4$ and $NH_3$. XPS results indicate a pure TiN phase with a stoichiometric Ti to N ratio (1:1) and no light element (e.g., C, O, F, etc.) contamination.
Figure 4:
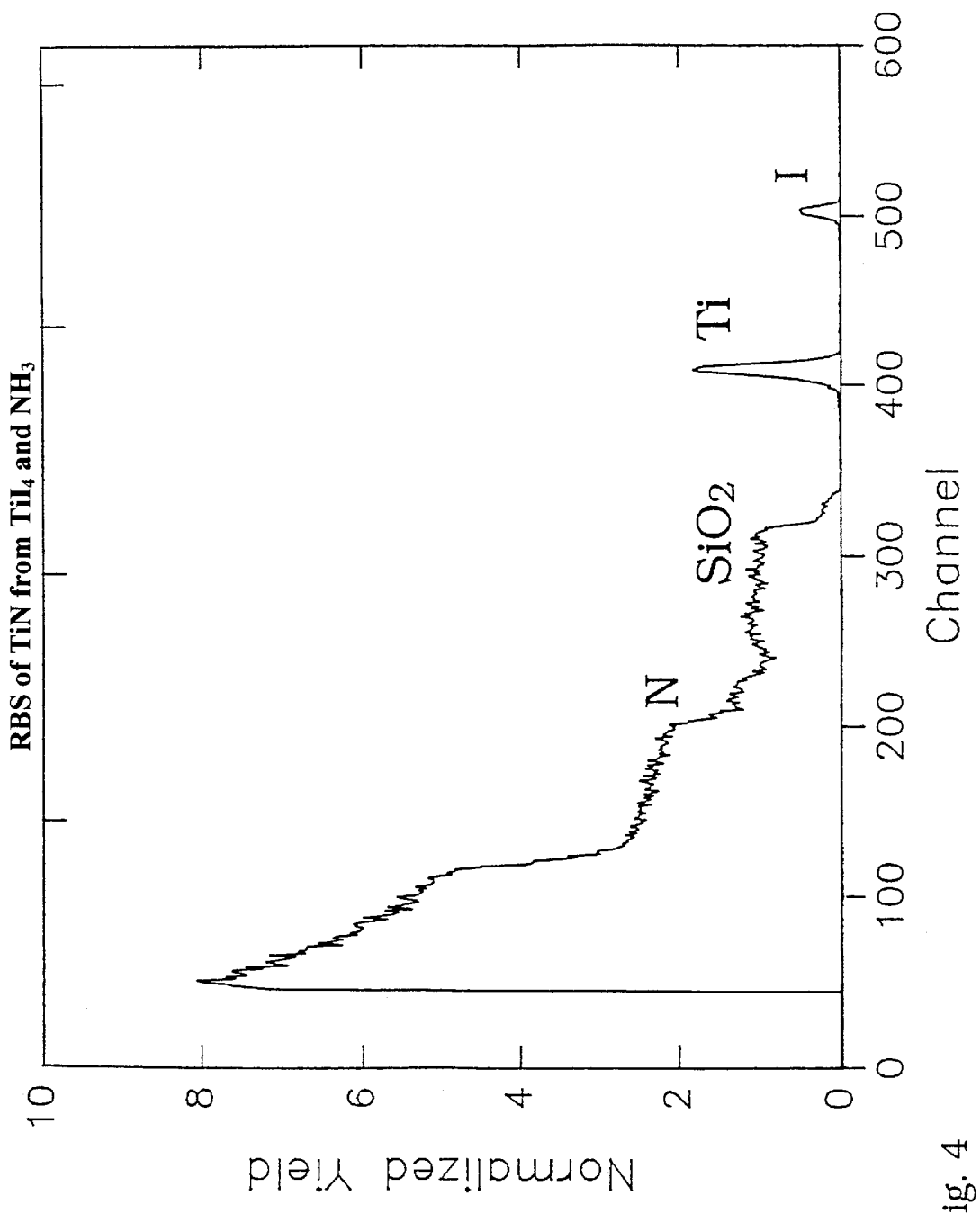
FIG. 4 is a Rutherford backscattering (RBS) spectrum of a TiN film produced by the TCVD reaction of $TiI_4$ and $NH_3$. RBS results indicate a pure TiN phase with a stoichiometric Ti to N ratio (1:1) and essentially no heavy element (e.g., Cr, Mn, etc.) contamination.

The titanium nitride films were typically metallic, continuous and gold colored. X-ray diffraction (XRD) analysis of a TiN film grown at 350° C. from $TiI_4$ is shown in FIG. 2 for a 1000 Å-thick film on Si. The film showed a polycrystalline TiN phase with major diffraction peaks appearing at 2θ=36.66°(111), 42.59°(200), 61.81°(220), and 74.07°(311). Essentially the same spectrum was observed when $TiBr_4$ was the source precursor. X-ray photoelectron spectroscopy (XPS) measurements were performed using a Perkin-Elmer Physical Electronics Model 10-360 spherical capacitor analyzer. The gold $f_{7/2}$ line at 83.8 eV was taken as reference line and the analyzer calibrated accordingly. All spectra were obtained using a pass energy of 5 eV at a resolution of 0.8 eV. A primary x-ray beam (Mg Kα, 127 ev) of 15 keV and 300 W was employed. The analysis chamber pressure was in the $10^{-10}$ torr range, and the results were standardized using a sputtered TiN sample. All samples were sputter-cleaned before data acquisition. The XPS survey spectra (FIG. 3) indicated that, within the detection limits of XPS, a TiN film prepared from $TiI_4$ as the source precursor was free of oxygen, carbon, and similar light element contaminants. In general, iodine concentrations, ranging from 0.4–1.5 atomic percent, were detected in the films. Rutherford backscattering (RBS) spectra were taken using a 2 MeV $HE^{2+}$ beam, and calibrated with a bulk sample of silicon. The RBS results, shown in FIG. 4 for a 1000 Å-thick TiN film on silicon, confirmed the XPS findings that the PPCVD process yields TiN films with extremely low iodine concentrations. In general, the TiN films contained greater than 99 atomic percent TiN, and this was observed when either $TiI_4$ or $TiBr_4$ was the source precursor.

Four-point probe resistivity measurements determined that film resistivities as low as 44 μΩcm were obtained when the source precursor was titanium tetraiodide. However, when the source precursor was titanium tetrabromide, film resistivities as low as 120 μΩcm were obtained.

The nature of the titanium nitride film vis-à-vis a silicon substrate was next examined. Cross-section SEM analyses were carried out on a Zeiss DSM940 microscope, employing a 20 keV primary electron beam and beam current of 4 μA. The SEM micrograph (FIG. 5) of a 700 Å-thick TiN film prepared from titanium tetraiodide as the source precursor, showed conformal step coverage of 0.25 μm vias with aspect ratio of 4. The adherence of the titanium nitride to either silicon or silicon dioxide was found to be good. Essentially the same results were obtained when titanium tetrabromide was the source precursor.

The films prepared according to the inventive methods are seen to have very high purity, and thus are well suited for use in, for example, microelectronic applications where purity demands are quite stringent. The films of the invention have carbon and hydrogen impurity levels of less than about 15 atomic percent, preferably less than about 10 atomic percent and more preferably less than about 1 atomic percent. The films of the invention have minimal or no halogen contamination, where the halogens are iodine, bromine or chlorine. Thus, films according to the invention will have halogen contamination of less than about 15 atomic percent, preferably less than about 5 atomic percent, and more preferably less than about 1 atomic percent.

Due in part to their high purity, the titanium-based films of the invention are seen to have desirably low resistivities. The inventive films have a resistivity of about 40 to about 5,000 microOhm-centimeters (μΩcm), preferably about 40 to about 1,000 μΩcm, and more preferably about 40 to about 150 μΩcm.

The titanium-based films of the invention may advantageously be tailored to columnar or non-columnar structure. The titanium-based films of the invention also have excellent adhesive properties when formulated into ULSI circuitry.

The inventive titanium nitride film, whether prepared by PPCVD or TCVD according to the invention, typically has a titanium to nitrogen ratio of about 0.9–1.1:0.9–1.1, and more preferably have a titanium to nitrogen ratio of about 1:1.

While our invention allows the separate and independent production of titanium-based films, and particularly films comprising mainly titanium metal or titanium nitride, in a preferred embodiment, the inventive method provides for in situ sequential CVD in which the deposition mode of a single precursor is smoothly and reversibly switched between Ti and TiN by changing auxiliary gases that can also act as carriers.

Thus, according to the inventive method, the reactor according to FIG. 1 is charged to contain vapor from a compound of formula (I), and preferably titanium tetraiodide vapor, in the presence of argon, hydrogen, and a plasma having a plasma power density of about 0.1 W/cm² to about 0.5 W/cm². As described previously, these reaction conditions result in the formation of a titanium film on a substrate. Then the plasma is turned off and the auxiliary gas is changed from argon to ammonia. Under these revised reaction conditions, a film of titanium nitride is deposited on top of the previously laid down titanium film, to provide a bilayer film of the invention.

It should be understood that the process could be reversed, i.e., the titanium nitride film could be laid down first on the substrate, followed by deposition of titanium metal film. Preferably, the titanium film is laid down so as to contact with the substrate, which is preferably a silicon substrate. It should also be understood that more than two compositionally diverse layers may be deposited on a substrate, without the need to remove the substrate from the reaction chamber.

It should also be understood that in preparing bilayer films, any method for preparing a titanium metal film according to the invention could be followed or preceded by any method for preparing a titanium nitride film according to the invention. For example, PPCVD with hydrogen carrier gas could be used to deposit a titanium metal film, followed by PPCVD with hydrogen and nitrogen as carrier and/or auxiliary gases, to deposit a titanium nitride film and thereby produce a bilayer.

The in situ deposition of a titanium-based bilayer as described is very convenient for the preparation of ULSI devices. The inventive method allows the formation of a bilayer without the necessity of transferring the partially coated substrate between reaction chambers. That the bilayer can be made in a single reaction chamber greatly minimizes the risk of contamination of the film, which may occur during transfer of the partially coated substrate between reaction chambers. Contamination is a particular problem for the titanium-based films of the invention, because these films are often very reactive and even slight amounts of contamination can destroy their usefulness in ULSI devices.

The titanium-based films of the invention may be deposited onto a wide range of substrates, in order to prepare materials useful in refractive, mechanical, microelectronic and decorative applications, to name a few. There is really no limitation on the identity of the substrate, however preferably the substrate is stable to the conditions used to deposit the film or coating onto the substrate. That is, the substrate should be stable to temperatures of about 200° C. to about 650° C., preferably to about 350° C. to about 500° C., and to pressures of about 0.1 torr to about 10 torr, preferably about 0.5 torr to about 5 torr.

The substrate of the invention may be metallic, that is, it may be comprised mainly of a metal. Exemplary metals include, without limitation, aluminum, beryllium, cadmium, cerium, chromium, cobalt, copper, gallium, gold, iron, lead, manganese, molybdenum, nickel, palladium, platinum, rhenium, rhodium, silver, stainless steel, steel, strontium, tin, titanium, tungsten, zinc, zirconium, and alloys thereof.

In microelectronic applications, a preferred substrate is intended to become an integrated circuit, and has a complex topography formed of holes, trenches, vias, etc., to provide the necessary connections between materials of various electrical conductivities that form a semiconductor device. The substrate is preferably formed of, for example, silicon, silicon dioxide, silicon nitride, or doped versions and mixtures thereof.

The substrates of the invention are preferably intended for ultra-large scale integrated (ULSI) circuitry, and are patterned with holes, trenches and other features with diameters of less than 1.0 micron, often less than 0.50 microns, and even 0.25 microns or less. Substrates having such small features are known herein as sub-micron substrates. Sub-micron substrates which may be coated according to the invention also typically have features with high aspect ratios, from about 3:1 to about 6:1, where the ratio of a feature's depth to its diameter, as viewed in cross-section, is termed the aspect ratio of the feature. As used herein, sub-micron substrate have feature diameters of less than about one micron and the aspect ratio of the features is larger than about 3:1. Features having an aspect ratio of about 4:1 to about 6:1 are found on typical substrates for ULSI circuitry.

According to the chemical vapor deposition processes of the invention, conformal coatings may be placed on sub-micron substrates. Conformal coatings of Ti or Ti/Si may be placed on sub-micron substrates having feature diameters as small as about 0.25 micron with aspect ratios as large as about 6:1. Conformal coatings of TiN or TiN/Ti bilayer may be placed on sub-micron substrates having feature diameters as small as about 0.25 micron with aspect ratios as large as about 4:1.

As used herein, the term conformal coating refers to a coating that evenly covers a substrate having a complex topography. The evenness of the coating can be measured by, for example, examining the thickness of the coating along the walls and bottom of a hole in the substrate, and determining the variation in the thickness of that coating. According to the invention, sub-micron substrates are conformally coated, when the coating has a thickness, measured at any point normal to the surface of a wall or floor of a hole in the surface of the substrate, which is within 25% of the thickness at any other point in the hole. According to a preferred embodiment, the variation in coating thickness is within 10%, i.e., at no point is the thickness of the coating either 10% greater or 10% smaller than the average thickness of the coating. The preferred coatings are titanium metal and titanium nitride, and the preferred substrate comprises at least one of silicon or silicon oxide.

As used herein, the term step coverage refers to the ratio of the coating thickness at the bottom of a feature such as a trench or via, to the thickness of the coating on the top surface of the substrate adjacent to the feature, where the ratio is multiplied by 100 to provide a percent value. The processes of the invention provide conformally coated sub-micron substrates having step coverage of greater than about 25% for features of high aspect ratios, where high aspect ratios are considered to be greater than about 3:1.

Figure 5:
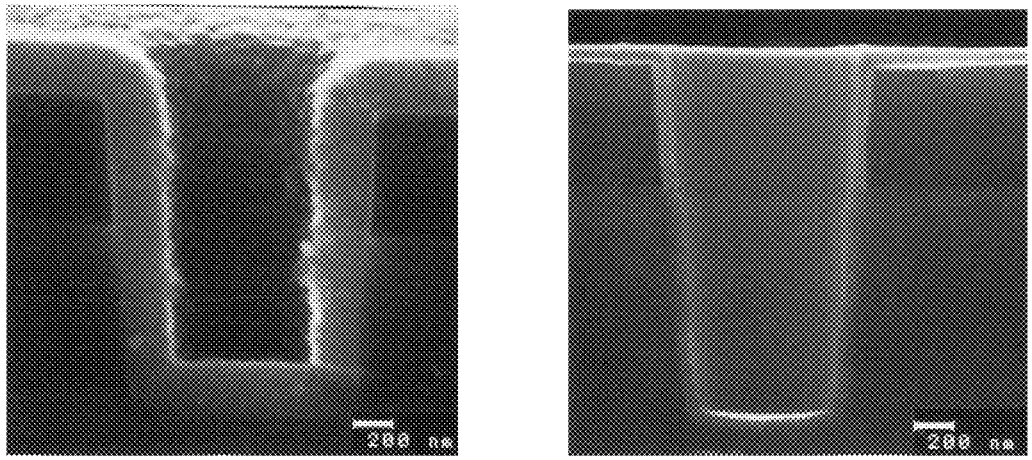
FIG. 5 depicts cross sections, magnified by scanning electron microscopy, of silicon substrates upon which oxide via patterns, of diameter 0.25 µm and 4 to 1 aspect ratio, are formed and upon which conformal TiN coatings have been deposited by TCVD reaction of $TiI_4$ and $NH_3$. The coating shown in the left-hand micrograph of FIG. 5 has a thickness of less than 100 nm, which is a typical film thickness for ULSI devices. The coating shown in the right-hand micrograph of FIG. 5 has a considerably thicker coating, and is shown to illustrate that conformal coatings are prepared even at extraordinarily high thickness.

FIG. 5 shows micrograph of two TiN films which were deposited onto sub-micron substrates using TCVD according to the invention. The micrograph on the left-hand side of FIG. 5 shows that a TiN film according to the invention is conformal to a via with a diameter of 0.25 micron and a 4:1 aspect ratio. The micrograph on the right-hand side of FIG. 5 shows a very thick coating of TiN deposited onto a silicon substrate having the same feature dimensions as depicted in the micrograph on the right-hand side of FIG. 5, and it can be seen that even after an extended deposition time, TCVD according to the invention provides a conformal coating with high step coverage. The films were prepared from titanium tetraiodide as the source precursor, and ammonia as the auxiliary gas.

Figure 8:
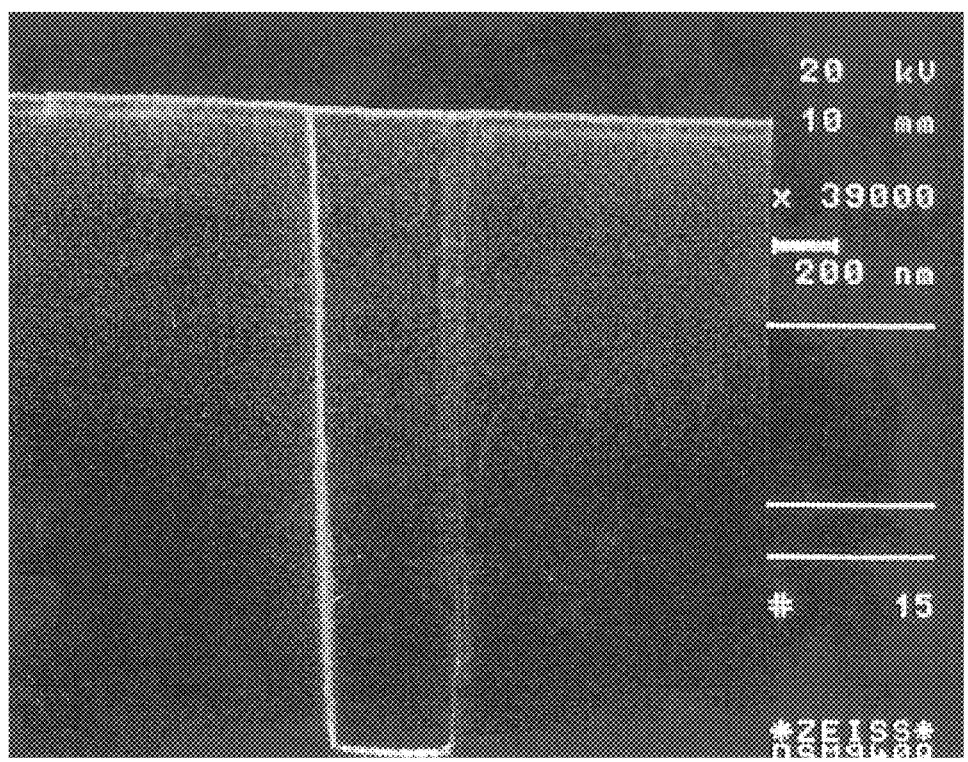
FIG. 8 depicts a cross section, magnified by scanning electron microscopy, of a silicon substrate upon which oxide via patterns, of diameter 0.2 µm and 6 to 1 aspect ratio, are formed and upon which a conformal Ti coating has been deposited by plasma-promoted CVD reaction of $TiI_4$ and hydrogen in an argon plasma.

FIG. 8 shows a micrograph of a Ti film which was deposited onto a sub-micron substrate having a via diameter of 0.2 microns and a 6:1 aspect ratio. The deposition was accomplished by PPCVD according to the invention, with titanium tetraiodide as the source precursor and hydrogen as the carrier gas and an argon plasma. The coating is seen to be conformal.

We have discovered that selected perhalogenated titanium compounds, in combination with argon, can be converted by means of mixed hydrogen-argon plasma in a CVD system, into high quality titanium films. Similarly, under thermal conditions, titanium nitride can be produced from reacting the same tetrahalotitanium compounds with ammonia, in the presence of a carrier gas. Exemplary reactions according to the invention can be summarized by the following equations, wherein $TiI_4$ is an exemplary tetrahalotitanium compound.

PPCVD: $TiI_4+H_2 \rightarrow Ti+HI$ (major byproduct)

PPCVD: $TiI_4+N_2+H_2 \rightarrow TiN+HI$ (major byproduct)

TCVD: $TiI_4+NH_3+H_2 \rightarrow TiN+NH_4I$ (major byproduct)

In contrast to prior art chemical vapor deposition methods, our invention provides films of higher purity, due to the near or complete absence of carbon and chlorine contamination. In contrast to sputtering techniques, our invention provides coatings on substrates suitable for ULSI fabrication.

While not wishing to be bound by theory, we offer the following explanation for the efficacy of our processes. In our method, we have selected inorganic titanium compounds in which the dissociation energy of primary bonds is relatively low, and thus we believe recombination can be interrupted by nitrogen radicals formed by interaction of diatomic nitrogen with a hydrogen plasma flow or by hydrogen radicals. The following Table 1, which shows properties of selected titanium halides, indicates that the bond energies of Ti—I and Ti—Br are much lower than that of Ti—Cl, as indicated by their lower heat of formation.

TABLE 1

|  | Form | $\Delta H_{formation}$ @ 298° C. kcal/mole | m.p. ° C. | b.p. ° C. | Molecular Weight | % Ti |
|---|---|---|---|---|---|---|
| $TiF_4$ | solid | −394 | 284 | sublimes | 123.89 | 38.6 |
| $TiCl_4$ | liquid | −192 | −24 | 136 | 189.71 | 25.2 |
| $TiBr_4$ | solid | −148 | 38 | 233 | 367.54 | 13.0 |
| $TiI_4$ | solid | −92 | 155 | 377 | 555.50 | 8.6 |

We believe that, under the conditions of plasma-promoted chemical vapor deposition, titanium tetraiodide dissociates in a first step to titanium triiodide and other lower coordinate species, and that the reassociation of titanium with iodine is interrupted by the presence of plasma nitrogen, leading to the formation of titanium nitride. This is in significant contrast to the reaction of titanium chloride with ammonia in which higher coordinate species must be involved in both transport and decomposition. See, e.g., R. T. Cowdell and G. P. A. Fowles, J. C. S. p. 2522, (1960).

In the case of titanium metal deposition, we believe that the deposition involves the formation of a titanium hydride intermediate from the titanium tetraiodide, and that the intermediate dissociates to form titanium by eliminating either hydrogen or hydrogen iodide.

The following examples are set forth as a means of illustrating the present invention and are not to be construed as a limitation thereon.

EXAMPLE 1

Preparation of TiN films by TCVD using $TiI_4/H_2/NH_3$

Thermally promoted chemical vapor deposition (TCVD) was carried out with the reactor shown in FIG. 1, using $TiI_4$ as the titanium source precursor. The tetraiodotitanium ($TiI_4$) precursor 10 was placed in the bubbler/sublimator 11, and 11 was heated by a combination of heating tape and an associated power supply 12, to 140° C. during the CVD process. A mass flow controller 13, which can be isolated from the bubbler by a high vacuum valve 14, controlled a flow of 20 sccm hydrogen carrier gas 15 through feedthrough 16 into the bubbler. The mixture of precursor vapor and hydrogen carrier gas was then transported through feedthrough 17, high vacuum isolation valves 18 and 19, and delivery line 20 into the CVD reactor 21. All transport and delivery lines and high vacuum isolation valves 17, 18, 19 and 20 were maintained at 120° C., using a combination heating tape and associated power supply 22, to prevent precursor recondensation.

The reactor 21 was a cold-wall, stainless-steel CVD reactor of size sufficient to hold an 8" wafer. It was equipped with a diode-type parallel plate-type plasma configuration made of two electrodes 23 and 24. The upper plate 23 served as the active electrode and was driven by the radio frequency (13.56 MHz) power supply 25. It was constructed in a "mesh" type pattern to allow unrestricted reactant flow to the substrate 26.

The substrate (wafer) 26 was placed on the lower, grounded plasma electrode 24, and was heated to 425° C. by an 8" boron nitride (BN)-encapsulated graphite heater 27. A hydrogen plasma was used for in-situ pre-deposition substrate cleaning at a plasma power density of 0.25 W/cm², while no plasma was employed during actual deposition. A specially designed shower head 28 and associated pumping lines 29 were employed to ensure proper reactant mixing and uniformity in reactant delivery and flow over the 8" wafer.

The pumping stack 30 consisted of two pumping packages: the first, cryogenic pump-based, and the second, roots blower pump-based The pumping stack was isolated from the reactor by the high vacuum gate valve 31. The cryogenic pump-based package was used to ensure high vacuum base pressure in the reactor while the roots blower-based package was employed for appropriate handling of the high gas throughput during actual CVD runs. A high vacuum load lock system 32 was used for transport and loading of 8" wafers into the reactor. Finally, a side line 33 was employed to feed the ammonia ($NH_3$) gas into the reactor. The $NH_3$ flow was 425 liters/minute and was controlled by the mass flow controller 34 and associated isolation valve 35. Processing pressure was 0.2 torr.

The resulting TiN film was metallic, continuous and gold-colored, and had properties typical of TiN films according to the invention, as previously described.

EXAMPLE 2

Preparation of TiN films by TCVD using $TiBr_4/H_2/NH_2$

The process as described in Example 1 was essentially repeated, but the source precursor was changed to titanium tetrabromide ($TiBr_4$) instead of $TiI_4$. The runs were performed under processing conditions similar to those listed above for $TiI_4$, except the temperature of the bubbler/sublimator 11 was heated in this case to 100° C. during the CVD process. All transport and delivery lines and high vacuum isolation valves 17, 18, 19 and 20 were maintained at a temperature of 90° C., using a combination heating tape and associated power supply 22, to prevent precursor recondensation.

The TiN films produced by TCVD of $TiBr_4$ were again metallic, continuous, and gold colored. Analyses by x-ray diffraction (XRD), x-ray photoelectron spectroscopy (XPS), Rutherford backscattering (RBS), four-point probe, and cross-sectional SEM (CS-SEM), indicated that their structural, chemical, and electrical properties are equivalent to those produced by TCVD of $TiI_4$ as in Example 1, except for film resistivity, which was 140 $\mu\Omega$cm in this case.

EXAMPLE 3

Preparation of Ti film by PPCVD using $TiI_4/H_2/Ar$

The CVD reactor shown in FIG. 1 was employed for the deposition of Ti by PPCVD. The tetraiodotitanium ($TiI_4$) precursor 10 was placed in the bubbler/sublimator 11 which was heated by a combination heating tape and associated power supply 12 to 140° C. during actual processing. A mass flow controller 13, which can be isolated from the bubbler by a high vacuum valve 14, controlled a flow of 28 sccm hydrogen carrier gas 15 through feedthrough 16 into the bubbler. The mixture of precursor vapor and hydrogen carrier gas was then transported through feedthrough 17, high vacuum isolation valves 18 and 19, and delivery line 20 into the CVD reactor 21. All transport and delivery lines and high vacuum isolation valves 17, 18, 19, and 20 were maintained at temperatures in the range 120° to 160° C. using a combination heating tape and associated power supply 22, to prevent precursor recondensation. The reactor 21 was equipped with a diode-type parallel plate-type plasma configuration made of two electrodes 23 and 24. The upper plate 23 served as the active electrode and was driven by the radio frequency (13.56 MHz) power supply 25.

In this case, plasma-promoted CVD (PPCVD) was employed for the growth of Ti thin films. Accordingly, a hydrogen plasma was used for in situ pre-deposition substrate cleaning at a plasma power density of about 0.25 W/cm$^2$, while an argon plasma was employed during actual deposition at a plasma power density of about 0.25 W/cm$^2$. The side line 33 was employed to feed the argon (Ar) gas into the reactor. The argon flow of 500 liters/minute was controlled by the mass flow controller 34 and associated isolation valve 35. The substrate (wafer) 26 was placed on the lower, grounded plasma electrode 24, and was heated to 450° C. by an 8" boron nitride (BN)-encapsulated graphite heater 27.

The titanium metal film thus produced was metallic, continuous silver-colored and had physical and electrical properties identical to those previously described for typical titanium metal films made according to the invention.

EXAMPLE 4

In-situ Sequential Preparation of Ti/TiN bilayers by PPCVD using TiI$_4$/H$_2$/Ar followed by TCVD using TiI$_4$/H$_2$/NH$_3$ The CVD reactor shown in FIG. 1 was employed for the in-situ sequential deposition of a Ti/TiN bilayer from TiI$_4$. The Ti layer was first grown by the PPCVD described in Example 3. Then the plasma was turned off and the auxiliary gas changed from argon to ammonia to form a TiN layer essentially as described in Example 1. A TiN layer was thus grown on top of the Ti layer to form a laminate bilayer. The Ti and TiN films were analyzed as described earlier and found to exhibit typical properties.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. A method for depositing multiple layers of titanium-based film onto a substrate by sequential chemical vapor deposition (CVD), comprising the steps of introducing a substrate and a source precursor into a CVD chamber, wherein the source precursor is a vapor of at least one compound of formula (I):

$$\text{Ti}(\text{I}_{4-m-n})(\text{Br}_m)(\text{Cl}_n) \tag{I}$$

wherein m is 0–4 and n is 0–2; and sequentially depositing onto the substrate at a temperature of about 200–650° C. layers of titanium metal film and titanium nitride film, wherein either the titanium metal film or the titanium nitride film may be deposited first onto the substrate and wherein at least the titanium metal film is deposited in the presence of a plasma, with hydrogen halides or ammonium halides being major byproducts of the deposition.

2. The method according to claim 1, wherein a titanium metal film is deposited onto a substrate to provide a coated substrate, and a titanium nitride film is deposited onto the coated substrate.

3. The method according to claim 1, wherein hydrogen gas is present in the chamber with said vapor and said substrate, and said chamber contains a plasma having a low power density, for a time sufficient to deposit a titanium metal film onto the substrate.

4. The method according to claim 3, wherein an inert gas selected from the group consisting of argon and xenon is additionally present in the chamber during deposition of the titanium metal film.

5. The method according to claim 1, wherein the source precursor is titanium tetraiodide vapor.

6. The method according to claim 1, wherein a nitrogen-containing gas is present in said chamber with said substrate and said vapor, and said chamber contains a plasma having a low power density, for a time sufficient to deposit a titanium nitride film onto the substrate.

7. The method according to claim 6, wherein the nitrogen-containing gas is selected from the group consisting of
   (a) hydrogen and at least one of nitrogen, ammonia or hydrazine;
   (b) nitrogen and at least one of ammonia, argon or xenon; and
   (c) ammonia and at least one of argon and xenon.

8. The method according to claim 6, wherein the substrate is maintained at a temperature of about 350° C. to about 475° C.

9. The method according to claim 7, wherein the nitrogen-containing gas is hydrogen and nitrogen.

10. The method according to claim 1, wherein during deposition of titanium nitride film the deposition chamber additionally contains a first gas selected from the group consisting of ammonia and hydrazine; and a second gas selected from the group consisting of hydrogen, nitrogen, argon and xenon; and said substrate, said vapor, said first gas and said second gas are reacted under thermal conditions in the absence of a plasma for a time sufficient to deposit a titanium nitride film onto the substrate.

11. The method according to claim 10, wherein the first gas is ammonia and the second gas is hydrogen.

12. The method according to claim 1, wherein said substrate is a microelectronics substrate.

13. The method according to claim 12, wherein said substrate is silicon-containing.

14. The method according to claim 1, wherein n in formula (I) is equal to zero.

15. The method according to claim 1, wherein the layers are deposited without transfer of the substrate from the chamber so as to minimize contamination.

16. A method for chemical vapor deposition (CVD) of a titanium metal film onto a substrate, comprising introducing to a deposition chamber the following components:
   (a) a microelectronics substrate;
   (b) a vapor of a compound having the formula (I):

$$\text{Ti}(\text{I}_{4-m})(\text{Br}_m) \tag{I}$$

wherein m is 0–4; and
   (c) at least one of a carrier gas and an auxiliary gas for said vapor; and maintaining the substrate at a temperature of about 200 to 650° C. in the presence of a plasma for a time sufficient to deposit a titanium metal film onto the substrate, with hydrogen halides or ammonium halides being major byproducts of the deposition.

17. The method according to claim 16, wherein the substrate is maintained at a temperature of about 350° C. to about 475° C.

18. The method according to claim 16, wherein the compound of formula (I) is titanium tetraiodide.

19. The method according to claim 16, wherein the substrate is a silicon or silicon dioxide wafer useful in the manufacture of a ULSI device.

20. The method according to claim 16, wherein the plasma has a low power density.

21. A method for chemical vapor deposition (CVD) of a titanium nitride film onto a substrate, comprising introducing to a deposition chamber the following components:
   (a) a microelectronics substrate;
   (b) a vapor of a compound having the formula: $TiI_4$; and
   (c) at least one nitrogen-containing gas;
and maintaining the substrate at a temperature of about 200 to 650° C. for a time sufficient to deposit a titanium nitride film onto the substrate, with hydrogen iodides or ammonium iodides being major byproducts of the deposition.

22. The method according to claim 21, wherein the nitrogen-containing gas is selected from the group consisting of: (a) hydrogen and at least one of nitrogen and ammonia and at least one of argon and xenon; (b) nitrogen and at least one of ammonia, argon and xenon; and (c) ammonia and at least one of argon and xenon.

23. The method according to claim 22, wherein the nitrogen-containing gas is hydrogen and nitrogen.

24. The method according to claim 21, wherein the deposition is carried out in the presence of a plasma.

25. The method according to claim 21, wherein the substrate is a silicon or silicon dioxide wafer useful in the manufacture of ULSI devices.

26. A method for forming a conformal layer of a titanium-containing compound, comprising the steps of
   providing a silicon-containing substrate having formed thereon a via having sidewalls and a bottom wall, wherein the sidewalls are spaced apart less than 0.1 microns;
   providing a vapor of a compound containing $TiI_4$;
   maintaining said silicon-containing substrate at a temperature of about 200 to 650° for a selected period of time; and
   depositing on said sidewalls and said bottom wall a substantially continuous titanium-based film, with hydrogen iodides or ammonium iodides being major byproducts of the deposition.

27. The method according to claim 26, wherein the step of maintaining said silicon containing substrate at a temperature of about 200 to 650° C., includes the step of maintaining the silicon-containing substrate at a temperature of about 350 to 475° C.

28. The method according to claim 26, wherein said step of depositing a substantially continuous titanium-based film includes the step of forming a titanium-based film having a thickness of between about 50 angstroms and about 1500 anstroms.

29. The method according to claim 26, wherein the step of providing a silicon-containing substrate includes the step of providing a substrate having formed thereon a via with an aspect ratio of between about 3:1 and 6:1.

30. The method according to claim 21 wherein the temperature for maintaining the substrate is about 350–475° C.

* * * * *